(12) United States Patent
Kim et al.

(10) Patent No.: US 10,546,794 B2
(45) Date of Patent: Jan. 28, 2020

(54) METHOD OF REDUCING WARPAGE OF SEMICONDUCTOR PACKAGE SUBSTRATE AND DEVICE FOR REDUCING WARPAGE

(71) Applicant: SAMSUNG ELECTRONICS CO., LTD., Suwon-si (KR)

(72) Inventors: Seung Wan Kim, Suwon-si (KR); Deok Suk Jang, Suwon-si (KR); Jeong Ho Yeo, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 15/816,519

(22) Filed: Nov. 17, 2017

(65) Prior Publication Data

US 2018/0358277 A1 Dec. 13, 2018

(30) Foreign Application Priority Data

Jun. 12, 2017 (KR) .......................... 10-2017-0073249

(51) Int. Cl.
*H01L 23/31* (2006.01)
*H01L 21/67* (2006.01)
(Continued)

(52) U.S. Cl.
CPC ...... *H01L 23/3128* (2013.01); *H01L 21/4846* (2013.01); *H01L 21/67092* (2013.01); *H01L 23/13* (2013.01); *H01L 23/481* (2013.01); *H01L 23/5389* (2013.01); *H01L 24/20* (2013.01); *H01L 21/67109* (2013.01); *H01L 21/67115* (2013.01); *H01L 24/03* (2013.01); *H01L 24/05* (2013.01); *H01L 24/13* (2013.01); *H01L 24/16* (2013.01); *H01L 24/24* (2013.01); (Continued)

(58) Field of Classification Search
None
See application file for complete search history.

(56) References Cited

U.S. PATENT DOCUMENTS 3,762,973 A * 10/1973 Gabrail .................. H01L 21/00
    156/253
6,046,060 A * 4/2000 Budnaitis ................ H01L 23/13
    257/E23.004

(Continued)

FOREIGN PATENT DOCUMENTS

JP    2001-308218 A    11/2001
KR    10-1016997 B1    2/2011
(Continued)

OTHER PUBLICATIONS

Office Action issued in Taiwanese Patent Application No. 106139623, dated Sep. 28, 2018 (English translation).
(Continued)

*Primary Examiner* — Alexander G Ghyka
(74) *Attorney, Agent, or Firm* — Sughrue Mion, PLLC

(57) ABSTRACT

Embodiments disclosed are directed to a method of reducing warpage of a semiconductor package substrate, and a warpage reducing device. The method includes preparing the semiconductor package substrate, heating the prepared semiconductor package substrate, forming at least one bend in the heated semiconductor package substrate, and cooling the semiconductor package substrate having the at least one bend is formed.

8 Claims, 13 Drawing Sheets

(51) Int. Cl.
    *H01L 23/48*     (2006.01)
    *H01L 23/13*     (2006.01)
    *H01L 23/538*     (2006.01)
    *H01L 23/00*     (2006.01)
    *H01L 21/48*     (2006.01)
    *H01L 25/00*     (2006.01)
    *H01L 25/065*     (2006.01)

(52) U.S. Cl.
CPC .............. *H01L 24/32* (2013.01); *H01L 24/73* (2013.01); *H01L 25/0655* (2013.01); *H01L 25/50* (2013.01); *H01L 2224/0231* (2013.01); *H01L 2224/02377* (2013.01); *H01L 2224/0401* (2013.01); *H01L 2224/05124* (2013.01); *H01L 2224/13024* (2013.01); *H01L 2224/16227* (2013.01); *H01L 2224/211* (2013.01); *H01L 2224/24225* (2013.01); *H01L 2224/32225* (2013.01); *H01L 2224/73204* (2013.01); *H01L 2924/3511* (2013.01)

(56) References Cited

U.S. PATENT DOCUMENTS

| | | | |
|---|---|---|---|
| 6,188,838 B1 * | 2/2001 | Mikata | .................... C30B 31/14 118/724 |
| 8,642,445 B2 | 2/2014 | Chen et al. | |
| 2007/0267773 A1 | 11/2007 | Kishimoto et al. | |
| 2008/0299784 A1 * | 12/2008 | Jin | .................... H01L 21/67109 438/799 |
| 2009/0137084 A1 * | 5/2009 | Kida | ...................... H01L 24/16 438/107 |
| 2013/0260535 A1 * | 10/2013 | Chen | ...................... B29C 53/18 438/460 |
| 2014/0182788 A1 * | 7/2014 | Falster | .................. H01L 21/302 156/443 |
| 2015/0194389 A1 | 7/2015 | Yew et al. | |
| 2016/0322234 A1 | 11/2016 | Lew et al. | |
| 2017/0103951 A1 | 4/2017 | Lee et al. | |

FOREIGN PATENT DOCUMENTS

| | | |
|---|---|---|
| KR | 10-2016-0126947 A | 11/2016 |
| KR | 10-2017-0043440 A | 4/2017 |
| TW | 201532215 | 8/2015 |
| TW | 201622066 | 6/2016 |
| TW | 201705335 | 2/2017 |
| WO | 2016048383 | 3/2016 |

OTHER PUBLICATIONS

Korean Office Action dated Nov. 19, 2018 issued in Korean Patent Application No. 10-2017-0073249 (with English translation).

* cited by examiner

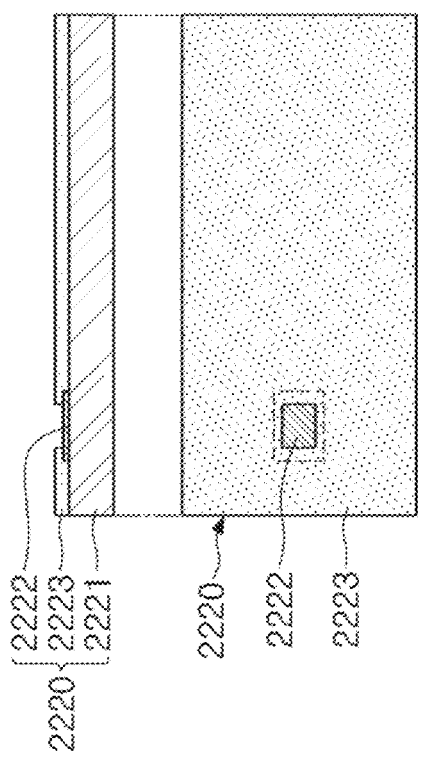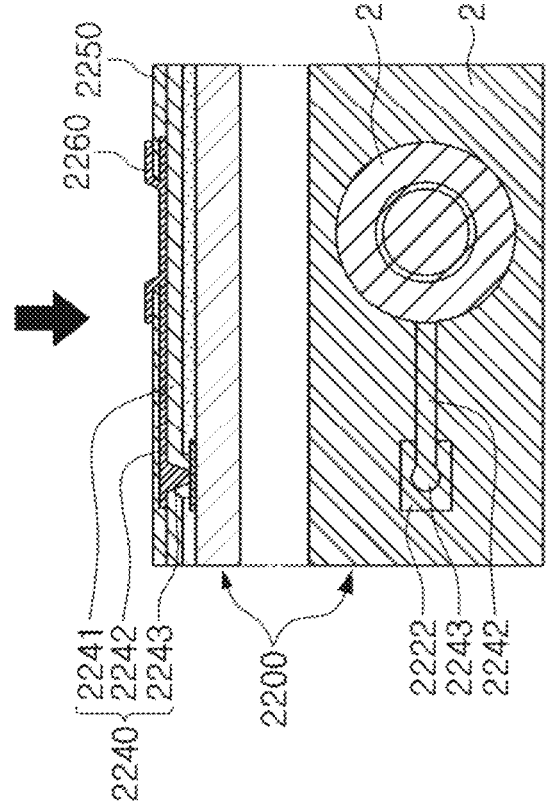

METHOD OF REDUCING WARPAGE OF SEMICONDUCTOR PACKAGE SUBSTRATE AND DEVICE FOR REDUCING WARPAGE

CROSS-REFERENCE TO RELATED APPLICATION

This application claims priority under 35 U.S.C. § 119 from Korean Patent Application No. 10-2017-0073249 filed on Jun. 12, 2017, in the Korean Intellectual Property Office (KIPO), the disclosure of which is incorporated herein by reference in its entirety.

BACKGROUND

1. Field

The present disclosure relates to a method of reducing warpage of a semiconductor package substrate, and more particularly, to a method of reducing warpage of a semiconductor package substrate on which a plurality of semiconductor packages are arranged and connected to each other, and a device for reducing warpage.

2. Description of Related Art

Recently, a trend in the development of technology related to semiconductor chips has been to reduce the size of semiconductor chips. Therefore, in the field of package technology, in accordance with an increase in demand for miniaturized semiconductor chips, or the like, semiconductor packages have an increasingly compact size, while including an increased number of pins.

One type of package technology for satisfying this demand is a wafer level package (WLP). Examples of a wafer level package include a fan-in wafer level package and a fan-out wafer level package. In particular, a fan-out semiconductor package has a compact size and includes relatively more number of pins.

Generally, a semiconductor package is manufactured by manufacturing a package substrate on a carrier substrate and cutting the package substrate into a plurality of unit semiconductor packages through a cutting process. However, when the package substrate is separated from the carrier substrate, warpage of the package substrate occurs.

SUMMARY

An aspect of the present disclosure may provide a method and a device for reducing warpage of a semiconductor package substrate.

According to an aspect of the present disclosure, a method of reducing warpage of a semiconductor package substrate may be provided, in which the warpage of the semiconductor package substrate is controlled by heating the semiconductor package substrate, forming at least one predetermined bend in the semiconductor package substrate, and then cooling the semiconductor package substrate.

According to an aspect of the present disclosure, a method of reducing warpage of a semiconductor package substrate may include: preparing the semiconductor package substrate; heating the prepared semiconductor package substrate; forming at least one bend in the heated semiconductor package substrate; and cooling the semiconductor package substrate having the at least one bend.

According to another aspect of the present disclosure, a warpage reducing device may include: a first connection part and a second connection part opposite each other in a first direction; a first support member connected to the first and second connection parts and extending in the first direction; and a first pressing member connected to the first and second connection parts and extending in the first direction, wherein a target is disposed between the first support member and the first pressing member and at least one of the first support member and the first pressing member moves in a second direction to exert a compressive force on the target, and thereby form a plurality of bends in the target.

BRIEF DESCRIPTION OF DRAWINGS

The following figures are included to illustrate certain aspects of the embodiments, and should not be viewed as exclusive embodiments. The subject matter disclosed is capable of considerable modifications, alterations, combinations, and equivalents in form and function, as will occur to those skilled in the art and having the benefit of this disclosure.

FIG. 3A is a schematic cross-sectional view of a fan-in semiconductor package prior to being packaged.

FIG. 3B illustrates a plan view of the fan-in semiconductor package of FIG. 3A.

FIG. 3C is a schematic cross-sectional view of the fan-in semiconductor package of FIGS. 3A and 3B after being packaged.

FIG. 3D illustrates a plan view of the fan-in semiconductor package of FIG. 3C.

DETAILED DESCRIPTION

Hereinafter, exemplary embodiments in the present disclosure will be described with reference to the accompanying drawings. In the accompanying drawings, shapes, sizes, and the like, of components may be exaggerated or shortened for clarity.

As used herein, a lower side, a lower portion, a lower surface, and the like, are used with reference to the drawings and may refer to a direction in which connection terminals of the fan-out semiconductor package or a package-on-package device are disposed in relation to the drawings, while an upper side, an upper portion, an upper surface, and the like, are used to refer to an opposite direction. However, these directions are defined for convenience of explanation, and the claims are not particularly limited by the directions defined as described above.

As used herein, a "connection" of a first component with a second component, and any variations thereof, include an indirect connection between the first and second components through one or more other components as well as a direct connection between the first and second components. As used herein, "electrically connected" and any variation thereof refer to a physical connection and a physical disconnection. It can be understood that when an element is referred to with "first" and "second", the element is not limited thereby. They may be used only for a purpose of distinguishing the elements from each other, and may not limit the sequence or importance of the elements. In some cases, a first element may be referred to as a second element, without departing from the scope of the disclosure. Similarly, a second element may be referred to as a first element, without departing from the scope of the disclosure. Stated otherwise, even though an element may be referred to as a first or second element interchangeably, and the scope of the disclosure is also not limited thereto.

As used herein, "an exemplary embodiment", and any variations thereof, may not refer to the same exemplary embodiment, and is used herein to emphasize a particular feature or characteristic different from another exemplary embodiment disclosed herein. However, exemplary embodiments provided herein may be combined in whole or in part with one or more other disclosed exemplary embodiments. For example, an element described in an exemplary embodiment, may be included in another exemplary embodiment even if not explicitly described therein, unless an opposite or contradictory description is provided.

Terms used herein are used only in order to describe an exemplary embodiment rather than limiting the present disclosure. In this case, singular forms include plural forms unless interpreted otherwise in context.

Electronic Device

Figure 1:
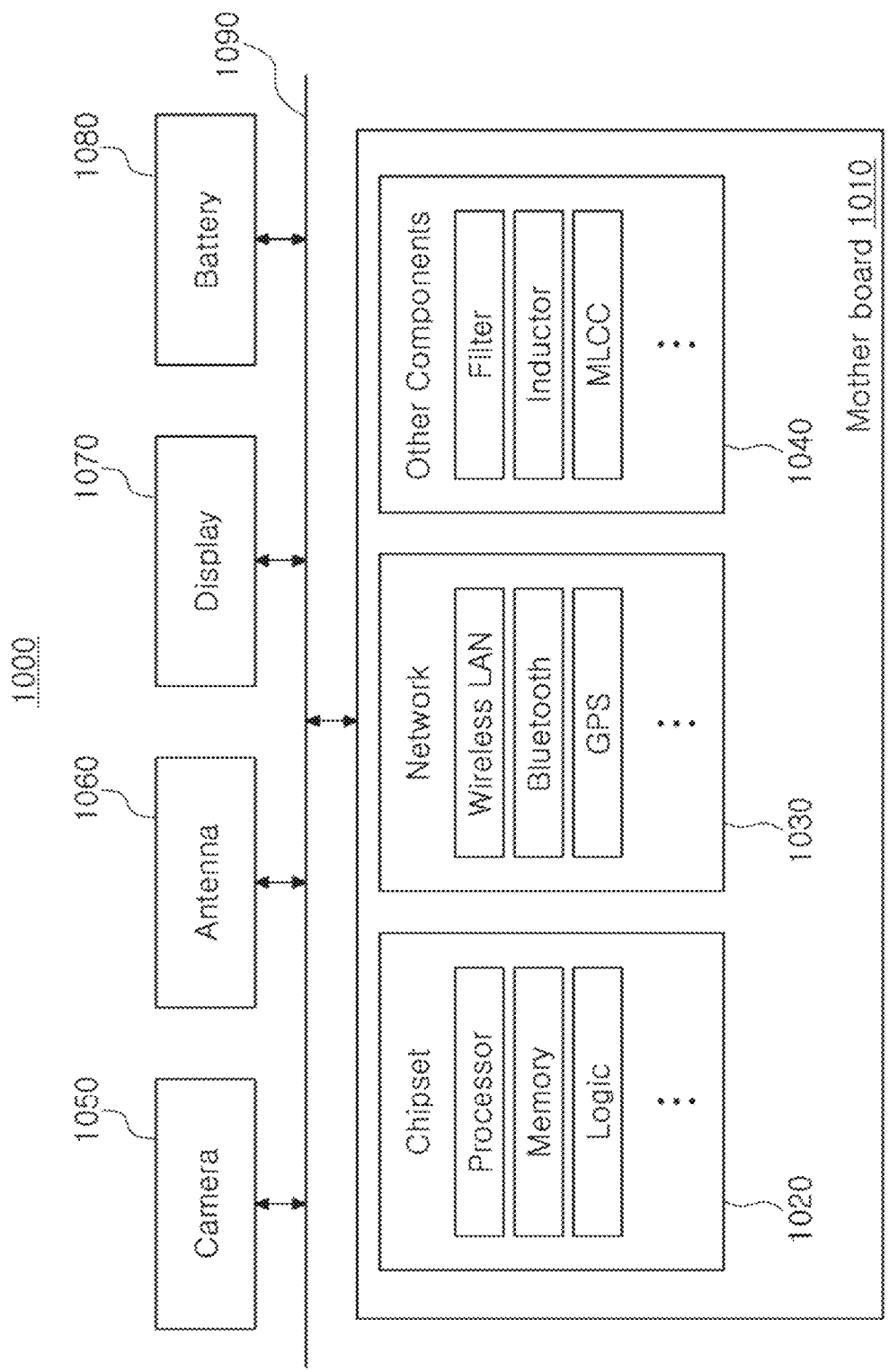
FIG. 1 is a schematic block diagram of an example electronic device system.

FIG. 1 is a block diagram illustrating an example electronic device 1000.

Referring to FIG. 1, the electronic device 1000 may include a main board (or motherboard) 1010 having chip related components 1020, network related components 1030, electrical components 1040, a combination thereof, and the like. In an example and as illustrated, the chip-related components 1020, the network-related components 1030, and the electrical components 1040 may be considered as "on-board" components that are installed on the main board 1010, as opposed to other electrical components that may be external to the main board 1010 and electrically connected thereto via signal lines 1090. The chip-related components 1020, network-related components 1030, and the electrical components 1040 may be connected to each other and to the other external components of the main board 101 via signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), a combination thereof, and the like. However, the chip related components 1020 are not limited thereto, but may also include other types of chip related components, without departing from the scope of the disclosure. In addition, although illustrated as discreet components, two or more chip related components 1020 may be combined with each other.

The network related components 1030 may include one or more electronic components for implementing protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols designated after the abovementioned protocols, a combination thereof, and the like. However, the network related components 1030 are not limited thereto, but may also include a variety of other wireless or wired standards or protocols, without departing from the scope of the disclosure. In addition, although illustrated as discreet components, the network related components 1030 may be combined with each other, and may further be combined with the chip related components 1020.

Electrical components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), a combination thereof, and the like. However, the electrical components 1040 are not limited thereto, but may also include passive components used for various other purposes, or the like. In addition, two or more electrical components 1040 may be combined with each other, or one or more electrical components 1040 may be combined with the chip related components 1020 and/or the network related components 1030.

Depending on a type of the electronic device 1000, and as discussed above, the electronic device 1000 may include electrical components that may be external to main board 1010. These electrical components may include, for example, a camera module 1050, an antenna 1060, a display device 1070, and a battery 1080. Although not illustrated expressly, an audio codec, a video codec, a power amplifier, a compass, an accelerometer, a gyroscope, a speaker, a mass storage unit (for example, a hard disk drive), a compact disk (CD) drive, a digital versatile disk (DVD) drive, a combination thereof, and the like. It will be understood that the components in the electronic device 1000 are not limited thereto, and the electronic device 1000 may include other components depending on the application and user requirement.

In an example, the electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, a combination thereof, and the like. However, the electronic device 1000 is not limited thereto, and may be or include other electronic data processing devices.

Figure 2:
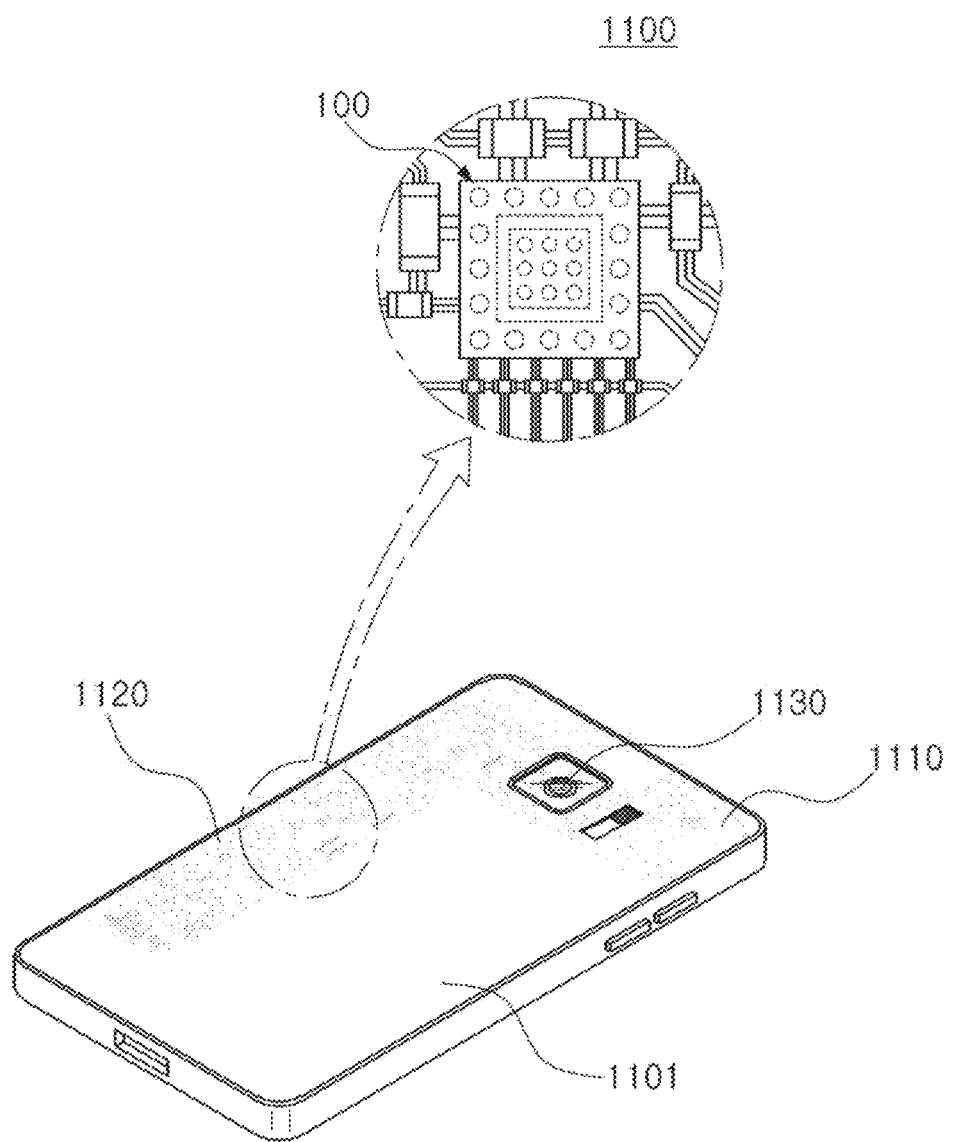
FIG. 2 is a perspective view of an example electronic device.

FIG. 2 is a schematic perspective view of an example electronic device 1100. In an embodiment, the electronic device 1100 may be or include one or more of the electronic devices 1000 mentioned above.

Referring to FIG. 2, a semiconductor package may be used for various purposes in the various electronic devices 1000 as described above. For example, a main board 1110 may be accommodated in a body 1101 of the electronic device 1100, which, as illustrated, may be a smartphone, and various electronic components 1120 may be physically or electrically connected to the main board 1110. However, the electronic device 1100 is not limited thereto. In addition, other components that may or may not be physically or electrically connected to the main board 1110, such as a camera module 1130, may be accommodated in the body 1101. Some of the electronic components 1120 may be the chip related components, for example, an application processor, a signal processor, etc. However, the electronic components 1120 are not limited thereto.

Semiconductor Package

Generally, multiple electrical circuits are integrated in a semiconductor chip. The semiconductor chip may be damaged due to external physical or chemical impacts. Therefore, the semiconductor chip may be packaged before using in an electronic device.

Here, semiconductor packaging may be required due to a difference in size of electrical connections between the semiconductor chip and a main board of the electronic device. In detail, a size of connection pads of the semiconductor chip and intervals between the connection pads of the semiconductor chip are substantially smaller than sizes of component mounting pads of the main board and intervals between the component mounting pads of the main board. Therefore, it may be difficult to directly mount the semiconductor chip on the main board, and packaging technology may reduce a difference in the size of the connections between the semiconductor chip and the main board.

A semiconductor package manufactured by the packaging technology may be classified as a fan-in semiconductor package or a fan-out semiconductor package depending on a structure and a purpose thereof.

The fan-in semiconductor package and the fan-out semiconductor package will hereinafter be described in more detail with reference to the drawings.

Fan-In Semiconductor Package

FIG. 3A is a schematic cross-sectional view of a fan-in semiconductor package prior to being packaged. FIG. 3B illustrates a plan view of the fan-in semiconductor package of FIG. 3A. FIG. 3C is a schematic cross-sectional view of the fan-in semiconductor package of FIGS. 3A and 3B after being packaged. FIG. 3D illustrates a plan view of the fan-in semiconductor package of FIG. 3C.

FIGS. 4A-4G illustrate the processing steps for manufacturing the fan-in semiconductor package in FIGS. 3C-3D.

Referring to FIGS. 3A-3D and 4A-4G, a semiconductor chip 2220 may be, for example, an integrated circuit (IC) having a body 2221 including silicon (Si), germanium (Ge), gallium arsenide (GaAs), a combination thereof, and the like, connection pads 2222 formed on one surface of the body 2221 and including a conductive material such as aluminum (Al), or the like, and a passivation layer 2223 such as an oxide film, a nitride film, a combination thereof, and the like, formed on one surface of the body 2221 and at least partially covering the connection pads 2222. Since the connection pads 2222 are relatively smaller in size, it is difficult to mount the integrated circuit (IC) on an intermediate printed circuit board (PCB) as well as on the main board of the electronic device.

Figure 4A:
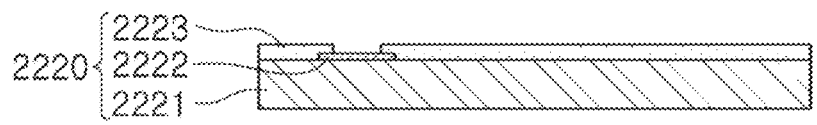
FIGS. 4A-4G illustrate the processing steps for manufacturing the fan-in semiconductor package in FIGS. 3C-3D.
Figure 4B:
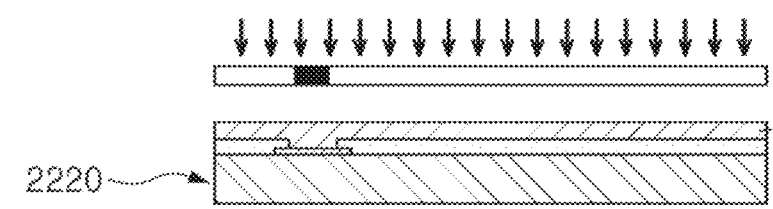
Figure 4C:
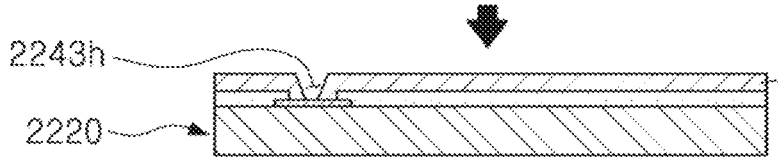
Figure 4D:
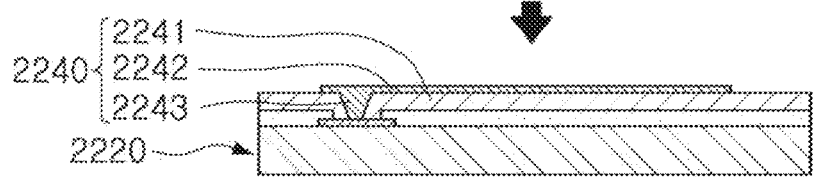

Therefore, an connection member 2240 may be formed depending on a size of the semiconductor chip 2220 on the semiconductor chip 2220 in order to redistribute the connection pads 2222. FIG. 4A illustrates the fan-in semiconductor package of FIG. 3A. Referring to FIGS. 4B, 4C and 4D, to form the connection member 2240, an insulating layer 2241 may be deposited on the semiconductor chip 2220. More specifically, the insulating layer 2241 may be deposited over the passivation layer 2223 and the connection pads 2222. The insulating layer 2241 may include an insulating material such as a photoimagable dielectric (PID) resin. As illustrated in FIGS. 4B and 4C, a via hole 2243*h* may then be formed in the insulating layer 2241 using photolithography and etching processes. Briefly, light 2217 of a specific wavelength is shined over the insulating layer 2241 through a mask 2215 having a pattern of the via hole 2243*h* formed therein. The etching process may be performed to remove the insulating layer 2241 to form the via 2243 (FIG. 4D).

Figure 4E:
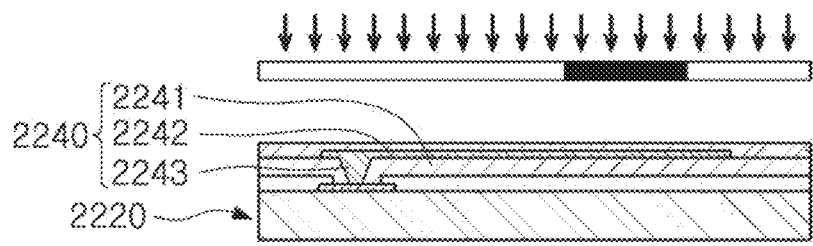
Figure 4F:
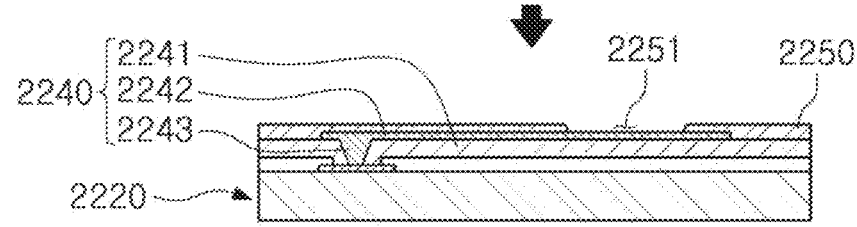

As illustrated in FIG. 4D, wiring patterns 2242 may then be formed on the insulating layer 2241 and in the via 2243 to connect to the connection pads 2222. Referring to FIGS. 4E and 4F, a passivation layer 2250 protecting the connection member 2240 may be formed, and photolithography and etching processes may be performed again to form an opening 2251 in the passivation layer 2250. Briefly, the photolithography and etching processes may include shining light on the passivation layer 2250 via a mask 2219 including a pattern corresponding to the opening 2251. The passivation layer 2250 is then etched away to form the opening 2251 and expose the underlying wiring patterns 2242.

Figure 4G:
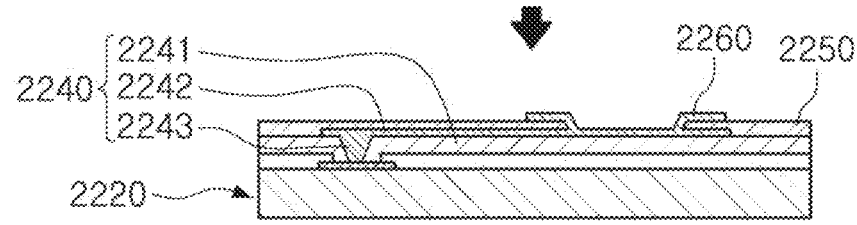

As illustrated in FIG. 4G, an underbump metal layer 2260 may be deposited in the opening 2251, and the fan-in semiconductor package of FIG. 3D may be obtained. Thus, a fan-in semiconductor package 2200 including the semiconductor chip 2220, the connection member 2240, the passivation layer 2250, and the underbump metal layer 2260 may be manufactured through multiple processing steps.

As described above, in the fan-in semiconductor package, all of the connection pads 222, which, for example, may be used as input/output (I/O) terminals of the semiconductor chip 2220, are disposed inside the semiconductor chip. As a result, the fan-in semiconductor package may have improved electrical characteristics and may be produced at a low cost. Due to the low cost and improved electrical characteristics, a variety of portable electronic devices, such as smartphones, media players, and the like, include components manufactured in a fan-in semiconductor package form. Such components allow faster signal transfer and have a compact size.

Because of the relatively small size of the connection pads 2222 and the small interval (or separation) between adjacent connection pads 2222 of the semiconductor chip, an intermediate circuit (also referred to as an interposer substrate)

may be used to mount the fan-in semiconductor package on the main board (e.g., main board 1010 in FIG. 1) of the electronic device.

Figure 5:
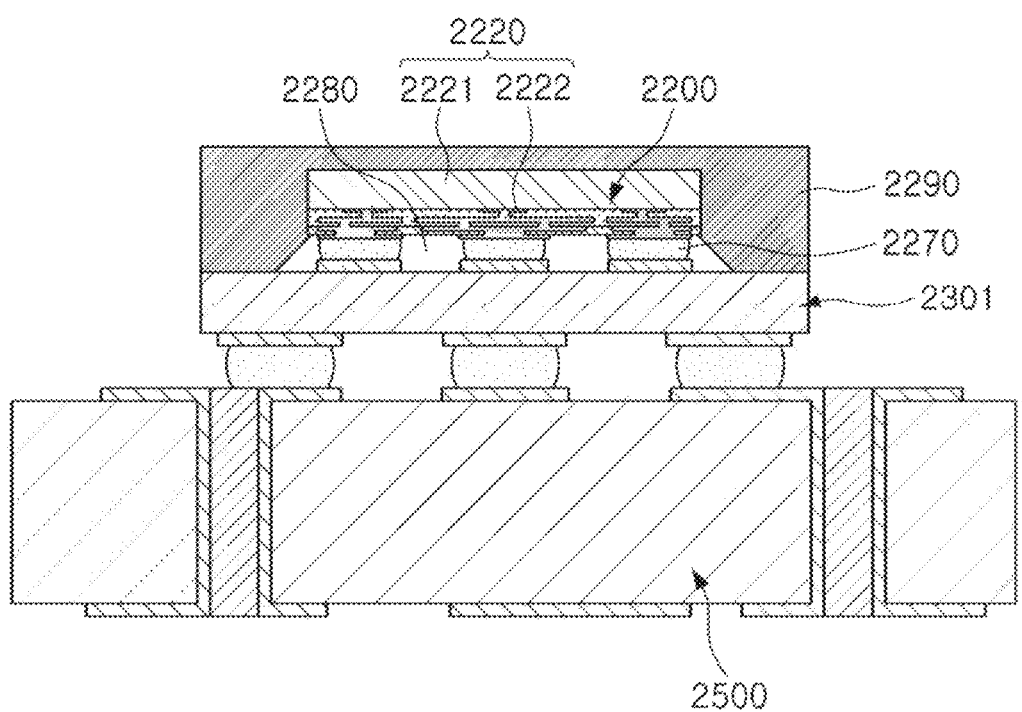
FIG. 5 is a schematic cross-sectional view of a fan-in semiconductor package mounted on an interposer substrate which is mounted on a main board of an electronic device.

FIG. 5 is a schematic cross-sectional view of a fan-in semiconductor package mounted on an interposer substrate which is then mounted on a main board 2500 of an electronic device.

Figure 6:
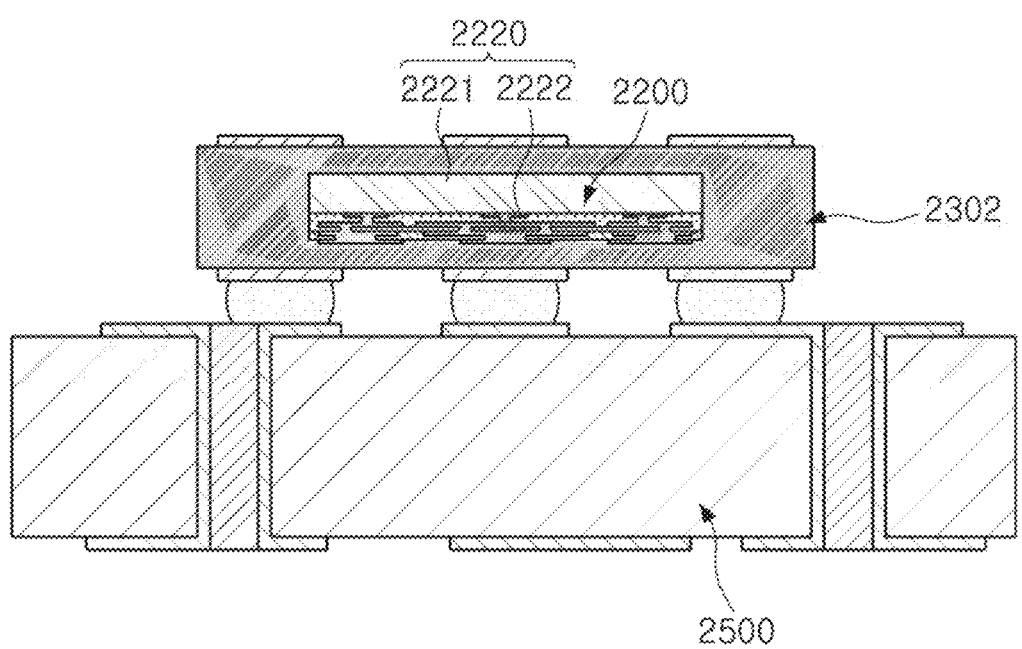
FIG. 6 is a schematic cross-sectional view of a fan-in semiconductor package embedded in an interposer substrate which is mounted on a main board of an electronic device.

FIG. 6 is a schematic cross-sectional view of a fan-in semiconductor package embedded in an interposer substrate which is then mounted on a main board 2500 of an electronic device.

In FIGS. 5 and 6, the electronic device may be the electronic device 1000 in FIG. 1 or a similar electronic device. Referring to FIGS. 5 and 6, and with continued reference to FIGS. 3A-3D and 4, in a fan-in semiconductor package 2200, the connection pads 2222 of the semiconductor chip 2220 may be redistributed through an interposer substrate 2301, and the fan-in semiconductor package 2200 may be mounted on a main board 2500 of an electronic device by mounting the fan-in semiconductor package 2200 on the interposer substrate 2301. In this case, solder balls 2270, and the like, may be fixed to the semiconductor package 2200 by an underfill resin 2280, or the like. The external surface of the semiconductor chip 2220 may be covered with a molding material 2290. Alternatively, as illustrated in FIG. 6, in order to redistribute the connection pads 2222 of the semiconductor chip 2220, the fan-in semiconductor package 2200 may be embedded in an interposer substrate 2302, and the fan-in semiconductor package 2200 may then be mounted on a main board 2500 of an electronic device.

Thus, connection pads 2222 having a relatively small size and small interval (or separation) may be connected to the main board of the electronic device.

Fan-Out Semiconductor Package

Figure 7:
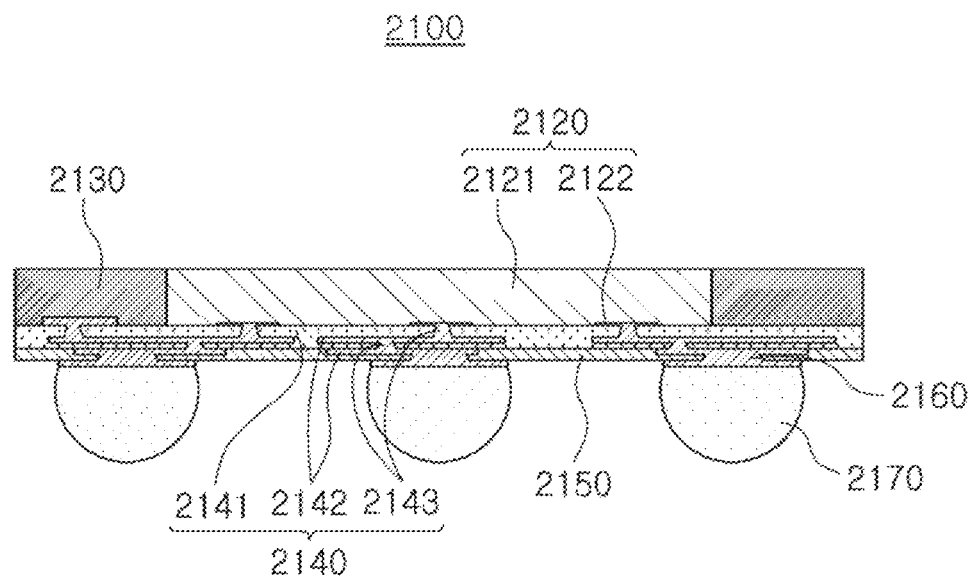
FIG. 7 is a schematic cross-sectional view of a fan-out semiconductor package.

FIG. 7 is a schematic cross-sectional view of a fan-out semiconductor package 2100.

Referring to FIG. 7, the fan-out semiconductor package 2100 may include a semiconductor chip 2120 having a body 2121 that is protected by an encapsulant 2130. The connection pads 2122 of the semiconductor chip 2120 may be redistributed externally (or otherwise "brought" to the outside) of the semiconductor chip 2120 by an interconnection member 2140. As illustrated, a passivation layer 2150 may be formed on or otherwise deposited on the interconnection member 2140, and an under-bump metal layer 2160 may be formed or otherwise deposited in openings of the passivation layer 2150. Solder balls 2170 may be formed or otherwise deposited on the under-bump metal layer 2160. The interconnection member 2140 may include an insulating layer 2141, redistribution layers 2142 formed on the insulating layer 2141, and vias 2143 connecting the connection pads 2122 and the redistribution layers 2142 with each other.

As described above, in the fan-in semiconductor package, all connection pads of the semiconductor chip may be disposed inside the semiconductor chip. Therefore, when a size of the semiconductor chip is reduced, a size and a pitch of balls may also be reduced, and, therefore, a non-standardized ball layout may be used in the fan-in semiconductor package. On the other hand, in the fan-out semiconductor package disclosed in FIG. 7, the connection pads (I/O terminals) of the semiconductor chip are redistributed external to the semiconductor chip through the interconnection member formed on the semiconductor chip. Therefore, even if a size of the semiconductor chip is reduced, it may be possible to use a standardized ball layout in the fan-out semiconductor package. Thus, an interposer may not be required to mount the fan-out semiconductor package on the main board of the electronic device, as described below.

Figure 8:
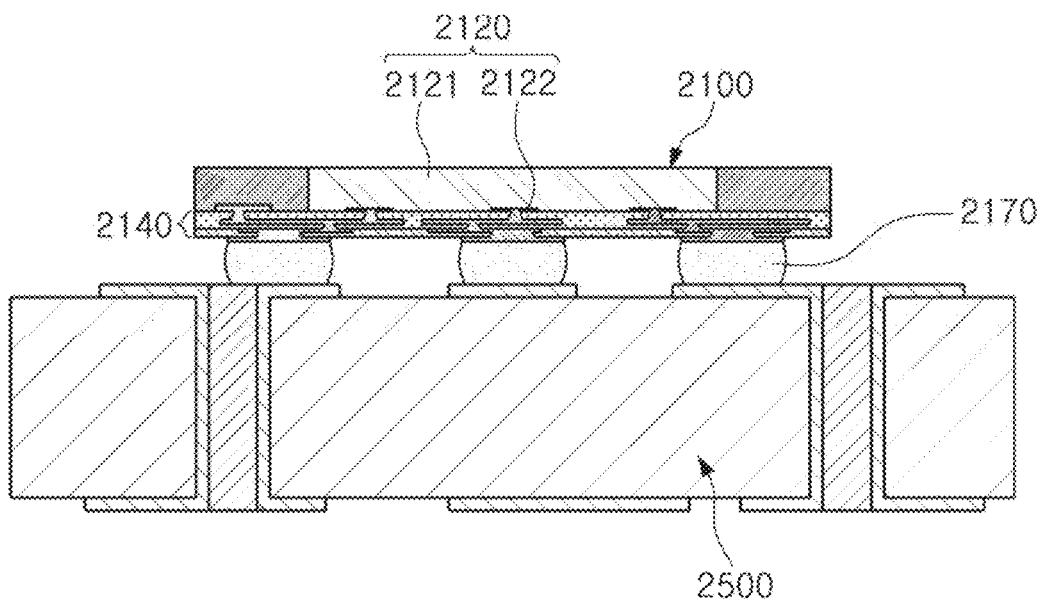
FIG. 8 is a schematic cross-sectional view of a fan-out semiconductor package mounted on a main board of an electronic device.

FIG. 8 is a schematic cross-sectional view of the fan-out semiconductor package 2100 mounted on a main board 2500 of an electronic device.

Referring to FIG. 8, the fan-out semiconductor package 2100 may be mounted on the main board 2500 of an electronic device using solder balls 2170, or similar connectors. The fan-out semiconductor package 2100 includes the interconnection member 2140 formed on the semiconductor chip 2120 for redistributing the connection pads 2122 to a fan-out region having an area greater than that of the semiconductor chip 2120, such that a standardized ball layout may be used in the fan-out semiconductor package 2100. As a result, the fan-out semiconductor package 2100 may be mounted on the main board 2500 of the electronic device without using a separate interposer substrate.

As described above, since the fan-out semiconductor package may be mounted on the main board of the electronic device without using the separate interposer substrate, a thickness of the fan-out semiconductor package may be lower than that of the fan-in semiconductor package using the interposer substrate. As a result, a size of the fan-out semiconductor package may be reduced. In addition, the fan-out semiconductor package has improved thermal characteristics and electrical characteristics, and a use thereof in a mobile product (e.g., a smartphone) may be desirable. Thus, the fan-out semiconductor package may be relatively more compact than a general package-on-package (POP) type using a printed circuit board (PCB) and warpage may be minimized.

As discussed above, in the fan-out semiconductor package, the semiconductor chip is mounted on the main board of the electronic device, and the semiconductor chip is protected from external impacts. In contrast, the fan-in semiconductor package is embedded in an interposer substrate, which is then mounted on the main board of the electronic device.

Semiconductor Package Substrate

Figure 9:
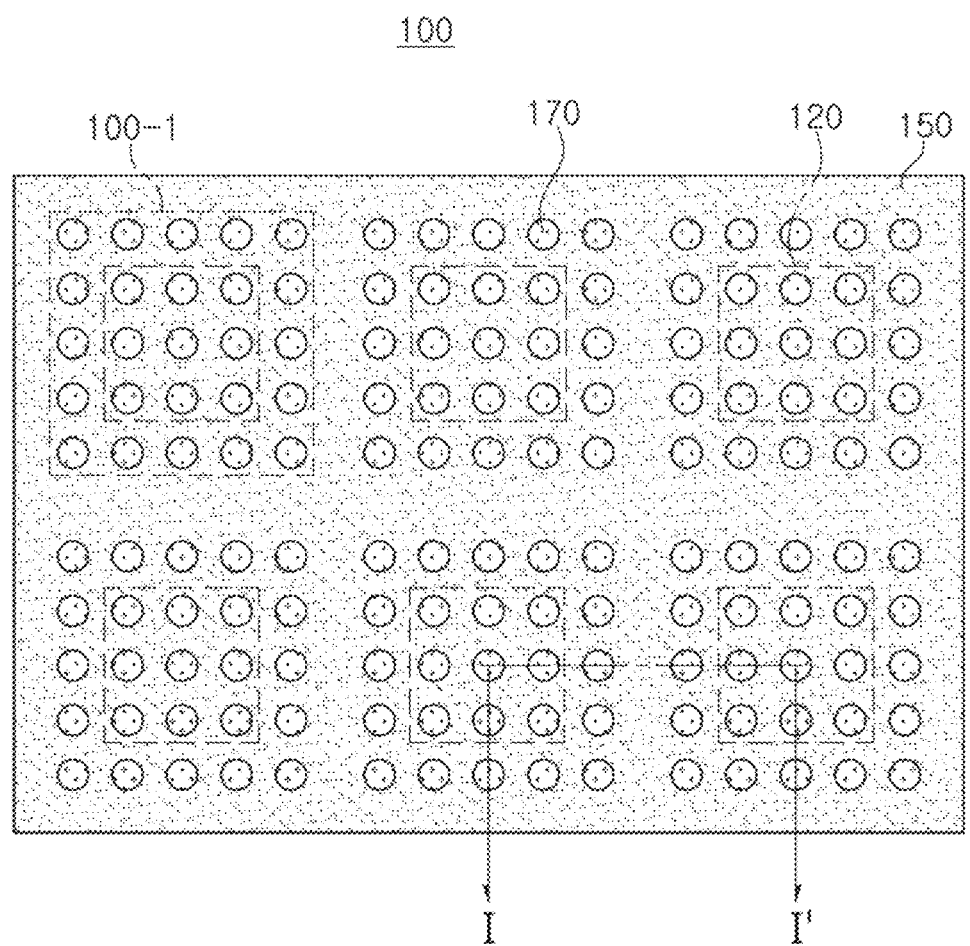
FIG. 9 is a schematic plan view of an example semiconductor package substrate, according to disclosed embodiments.

FIG. 9 is a schematic plan view of an example semiconductor package substrate 100, according to disclosed embodiments.

Figure 10:
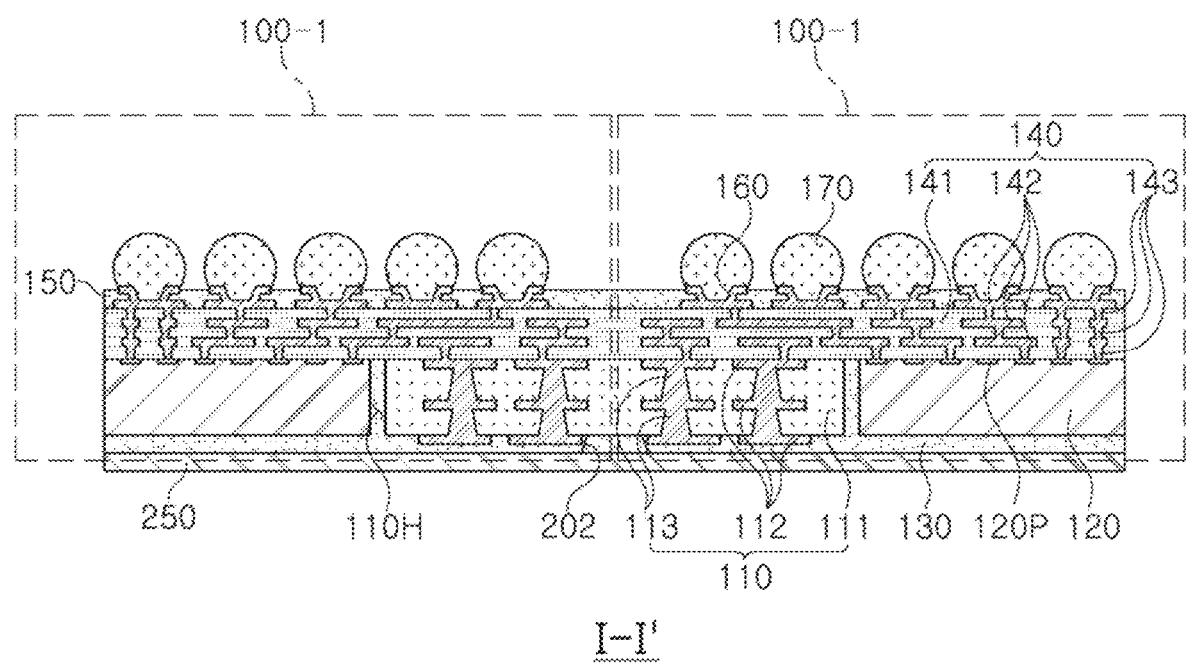
FIG. 10 is a schematic cross-sectional view taken along line I-I' of the semiconductor package substrate of FIG. 9.

FIG. 10 is a schematic cross-sectional view taken along line I-I' of the semiconductor package substrate 100.

Referring to FIGS. 9 and 10, the semiconductor package substrate 100 may include a plurality of unit packages 100-1 each including a first connection part 110 including an insulating layer 111 having redistribution layers 112 disposed therein and electrically connected to connection pads 120P of a semiconductor chip 120. A through-hole 110H may be formed in the first connection part 110 and the semiconductor chip 120 may be disposed in the through-hole 110H. The semiconductor chip 120 may have an active surface (e.g., the top surface in FIG. 10) having the connection pads 120P disposed thereon and an inactive surface (e.g., the bottom surface in FIG. 10) opposite the active surface. An encapsulant 130 may encapsulate at least some of the first connection part 110 and the semiconductor chip 120.

A second connection part 140 may be disposed on the first connection part 110 and the active surface of the semiconductor chip 120. The second connection part 140 may include redistribution layers 142 electrically connected to the connection pads 120P of the semiconductor chip 120. A passivation layer 150 may be disposed on the second connection part 140, and an underbump metal layer 160 may be formed in openings formed in the passivation layer 150. The underbump metal layer 160 may be electrically connected to the redistribution layer 142 of the second connection part 140.

Connection terminals 170 may be arranged on the semiconductor package substrate 100 and the connection terminals 170 may be disposed on the passivation layer 150 and electrically connected to the redistribution layer 142 through the underbump metal layer 160.

The first connection parts 110 of the adjacent unit packages 100-1 may contact each other. In addition, the encapsulants 130 of the adjacent unit packages 100-1 may contact each other. The second connection parts 140 of adjacent unit packages 100-1 may also be connected to each other. In addition, the passivation layers 150 of adjacent unit packages 100-1 may also be connected to each other.

The redistribution layer 112 of the first connection part 110 may improve a degree of freedom in a design of the second connection part 140. Stated otherwise, the redistribution layer 112 may provide a greater flexibility in designing the second connection part 140, and the semiconductor package substrate 100, in general.

The first connection part 110, and more specifically, the insulating layer 111, may improve rigidity of the semiconductor package substrate 100. In addition, the first connection part 110 may result in uniformity in a thickness of the encapsulant 130. In addition, the respective unit packages 100-1 may be utilized in a package-on-package device by the first connection part 110.

The semiconductor chip 120 may be disposed in the through-hole 110H and may be spaced from the first connection part 110 by a predetermined distance. Therefore, the semiconductor chip 120 may be stably disposed in the through-hole 110H since the encapsulant surrounds the semiconductor chip 120, thereby providing support to maintain a position of the semiconductor chip 120. In the example illustrated, side surfaces (e.g., the vertical surfaces in FIG. 10) of the semiconductor chip 120 may be surrounded by the first connection part 110. In other examples, the first connection part 110 may be omitted.

The first connection part 110 may include the insulating layer 111, the redistribution layers 112 disposed in or on the insulating layer 111, and vias 113 penetrating through the insulating layer 111 and electrically connecting the redistribution layers 112 formed on different layers in the insulating layer 111 to each other. Some of the redistribution layers 112 may be in contact with the second connection part 140 and may be on a first surface (e.g., the top surface in FIG. 10) of the insulating layer 111, some of the redistribution layers 112 may be embedded in a generally central portion (or region) of the insulating layer 111, and some of the redistribution layers 112 may be disposed on a second surface of the insulating layer 111 opposite the first surface.

A thickness of the redistribution layers 112 of the first connection part 110 may be greater than that of the redistribution layers 142 of the second connection part 140. For example, the redistribution layers 112 of the first connection part 110 that may have a thickness similar to that of the semiconductor chip 120 may be formed by a process based on a larger scale, and the redistribution layers 142 of the second connection part 140 that may be designed to be thinner than the redistribution layers 112 of the first connection part 110 may be formed by a process based on a smaller scale. In an example, the first connection part 110 may include the insulating layer 111, but may not include the redistribution layers 112 and/or the vias 113. In this case, the first connection part 110 may be utilized as only a support member.

A material of the insulating layer 111 is not particularly limited. For example, an insulating material may be used as the material of the insulating layer 111. In this case, the insulating material may be a thermosetting resin such as an epoxy resin, a thermoplastic resin such as a polyimide resin, a resin in which the thermosetting resin or the thermoplastic resin is mixed with an organic filler or is impregnated in a core material, together with an inorganic filler such as a glass fiber (or a glass cloth or a glass fabric), for example, prepreg, Ajinomoto Build up Film (ABF), FR-4, Bismaleimide Triazine (BT), or the like. Alternatively, a PID resin may also be used as the insulating material.

The redistribution layers 112 may redistribute the connection pads 120P of the semiconductor chip 120. The redistribution layers 112 may be or include a conductive material such as copper (Cu), aluminum (Al), silver (Ag), tin (Sn), gold (Au), nickel (Ni), lead (Pb), titanium (Ti), alloys thereof, or the like. The redistribution layers 112 may perform various functions depending on designs of their corresponding layers. For example, the redistribution layers 112 may include ground (GND) patterns, power (PWR) patterns, signal (S) patterns, and the like. Here, the signal (S) patterns may include various signals such as data signals, control signals, and the like, except for the ground (GND) patterns, the power (PWR) patterns, etc. Although not explicitly illustrated, the redistribution layers 112 may additionally include via pads, wire pads, connection terminal pads, and the like.

The vias 113 may electrically connect the redistribution layers 112 formed on different layers (or regions) of the first connection part 110 to each other, resulting in an electrical path in the first connection part 110. The vias 113 may be or include a conductive material. Each of the vias 113 may be completely filled with the conductive material, or the conductive material may be formed along a wall of each of via holes. In addition, each of the vias 113 may not have any specific shape and may be tapered, cylindrical, a combination thereof, and the like. As illustrated in FIG. 10, the vias 113 may have a tapered shape wherein the narrower end of the via 113 is closer to the via 143 of the second connection part 140 while the broader end of the via 113 is away from the via 143.

Each of the semiconductor chips 120 may be an integrated circuit (IC) in which several hundreds to several millions of components are integrated in a single chip. In this case, the integrated circuit may be a memory device, an application processor IC, a logic circuit, a combination thereof, and the like, but is not limited thereto. The semiconductor chip 120 may be silicon (Si), germanium (Ge), or gallium arsenide (GaAs) based device. Each of the semiconductor chips 120 may have the connection pads 120P. The active surface of the semiconductor chip 120 refers to a surface on which the connection pads 120P are disposed, and the inactive surface thereof refers to a surface opposite the active surface. The connection pads 120P may include a conductive material such as aluminum (Al), or the like, but are not limited thereto. In an example, a passivation layer (not illustrated) exposing the connection pads 120P may be formed on the body, and an insulating layer (not illustrated), or the like, may be further disposed in other required positions. Also, a redistribution layer (not illustrated) for redistributing the connection pads 120P may be formed on the active surface of the semiconductor chip 120.

The encapsulant 130 may protect the first connection part 110, and the semiconductor chip 120. The encapsulant 130 may surround at least portions of the first connection part 110 and the semiconductor chip 120. For example, the encapsulant 130 may cover the first connection part 110 and the inactive surface of the semiconductor chip 120, and fill the through-hole 110H. The encapsulant 130 may function as an adhesive and reduce buckling of the semiconductor chip 120. In an example, a plurality of different encapsulants may be deposited to form the encapsulant 130.

A material of the encapsulant 130 is not limited to any particular material. For example, the encapsulant 130 may be or include an insulating material. In this case, the insulating material may be a thermosetting resin such as an epoxy resin, a thermoplastic resin such as a polyimide resin, a resin in which the thermosetting resin or the thermoplastic resin is mixed with an organic filler or is impregnated together with an inorganic filler in a core material such as a glass fiber (or a glass cloth or a glass fabric), for example, prepreg, ABF, FR-4, BT, or the like. In other examples, the encapsulant 130 may be ABF including an insulating resin and an inorganic filler.

The second connection part 140 may redistribute the connection pads 120P of the semiconductor chip 120. Several tens to several hundreds of connection pads 120P of the semiconductor chip 120 having various functions (e.g., signal functions) may be redistributed by the second connection part 140, and may be physically or electrically connected to an external source through the connection terminals 170 depending on the functions. The second connection part 140 may include insulating layers 141 disposed on the first connection part 110 and the active surface of the semiconductor chip 120, the redistribution layers 142 disposed on or in the insulating layers 141, and the vias 143 penetrating through the insulating layers 141 and electrically connecting the redistribution layers 142 and/or the connection pads 120P formed on different layers to each other. The numbers of insulating layers 141, redistribution layers 142, and vias 143 of the second connection part 140 are not particularly limited, but may be changed depending on application and design.

A material of each of the insulating layers 141 may be an insulating material. For example, a photosensitive insulating material such as a PID resin may be used as the insulating material. That is, each of the insulating layers 141 may be a photosensitive insulating layer. When the insulating layer 141 has photosensitive properties, a thickness of the insulating layer 141 may be reduced, and a pitch of the via 143 may be reduced. The insulating layer 141 may be relatively rigid or inflexible due to an increased modulus of the resin in the insulating layer 141. Therefore, when cutting the insulating layer 141, a resin burr may be minimized.

The redistribution layers 142 may redistribute the connection pads 120P. A material of each of the redistribution layers 142 may be a conductive material such as copper (Cu), aluminum (Al), silver (Ag), tin (Sn), gold (Au), nickel (Ni), lead (Pb), titanium (Ti), or alloys thereof. The redistribution layers 142 may perform various functions depending on designs of their corresponding layers. For example, the redistribution layers 142 may include ground (GND) patterns, power (PWR) patterns, signal (S) patterns, and the like. Here, the signal (S) patterns may include various signals except for the ground (GND) patterns or the power (PWR) patterns, such as data signals, control signals, and the like. In addition, the redistribution layers 142 may include via pads, connection terminal pads, and the like.

The vias 143 may electrically connect the redistribution layers 142 to the connection pads 120P, or connect the redistribution layers 142 formed in the different layers of the insulating layer 141 to each other, thereby resulting in an electrical path in the second connection part 140. A material of each of the vias 143 may be a conductive material such as copper (Cu), aluminum (Al), silver (Ag), tin (Sn), gold (Au), nickel (Ni), lead (Pb), titanium (Ti), or alloys thereof. Each of the vias 143 may be completely filled with the conductive material, or the conductive material may also be formed along a wall of each of the vias. In addition, the vias 143 may not have any specific shape and may be tapered, cylindrical, a combination thereof, and the like. In case the vias 143 have a tapered shape, it may be beneficial if the broader end of the via 143 is disposed opposite the via 113 of the first connection part 110.

The passivation layer 150 may protect the second connection part 140 from external physical or chemical damage. The passivation layer 150 may have openings exposing at least portions of the redistribution layer 142 of the second connection part 140. A plurality of openings (e.g., several tens to several thousands) may be formed in the passivation layer 150. A material of the passivation layer 150 is not particularly limited. For example, an insulating material may be used as the material of the passivation layer 150. For example, the insulating material may be a thermosetting resin such as an epoxy resin, a thermoplastic resin such as a polyimide resin, a resin in which the thermosetting resin or the thermoplastic resin is mixed with an organic filler or is impregnated together with an inorganic filler in a core material such as a glass fiber (or a glass cloth or a glass fabric), for example, prepreg, ABF, FR-4, BT, or the like. Alternatively, a solder resist may also be used. In an example, the material of the passivation layer 150 may be ABF including an insulating resin and an inorganic filler like in the encapsulant 130.

The underbump metal layer 160 may improve connection reliability of the connection terminals 170, resulting in improvement of board level reliability of the unit package 100-1. The underbump metal layer 160 may be connected to the redistribution layer 142 of the second connection part 140 exposed through the openings of the passivation layer 150. The underbump metal layer 160 may be formed in the openings of the passivation layer 150 using any known metallization method. The underbump metal layer 160 may include any known conductive material such as a metal. In some embodiments, the underbump metal layer 160 may be omitted.

The connection terminals 170 may be configured to physically and electrically externally connect the respective unit packages 100-1. For example, the respective unit packages 100-1 may be mounted on the main board of the electronic device (e.g., the electronic device 1000) through the connection terminals 170 after being cut. Alternatively, the respective unit packages 100-1 may be mounted on another semiconductor package through the connection terminals 170. In this case, a package-on-package device may be manufactured. Each of the connection terminals 170 may be formed of a conductive material, for example, a solder. However, this is only an example, and a material of each of the connection terminals 170 is not limited thereto. Each of the connection terminals 170 may be a land, a ball, a pin, or the like. The connection terminals 170 may be formed as a multilayer or single layer structure. When the connection terminals 170 are formed as a multilayer structure, the connection terminals 170 may include a copper (Cu) (or any other metal) pillar and a solder. When the connection terminals 170 are formed as a single layer structure, the connection terminals 170 may include a tin-silver solder or copper (Cu). However, this is only an example, and the connection terminals 170 are not limited thereto.

The number, an interval, a disposition, or the like, of the connection terminals 170 is not particularly limited, but may be sufficiently modified by a person skilled in the art depending on design particulars and application requirements. For example, the connection terminals 170 may be provided in an amount of several tens to several thousands according to the number of connection pads 120P, or may be provided in an amount of several tens to several thousands or more or several tens to several thousands or less. When the connection terminals 170 are solder balls, the connection terminals 170 may cover side surfaces of the underbump metal layer 160 extending onto one surface of the passivation layer 150, and connection reliability may be further improved. At least one of the connection terminals 170 may be disposed in a fan-out region. The fan-out region is a region except for a region in which the semiconductor chip 120 is disposed. The fan-out package may have improved reliability as compared to a fan-in package, may implement a plurality of input/output (I/O) terminals, and may facilitate a 3D interconnection. In addition, as compared to a ball grid array (BGA) package, a land grid array (LGA) package, or the like, the fan-out package may be manufactured to have a reduced thickness, and may have lower manufacturing costs.

In an example, although not illustrated in the drawings, metal thin films may be formed on walls of the respective through-holes 110H in order to dissipate heat or block electromagnetic waves. In addition, separate passive components such as inductors, capacitors, or the like, may be disposed in the respective through-holes 110H, if required.

The semiconductor package substrate 100 may be disposed on and removably coupled to a carrier substrate 250. For example, the semiconductor package substrate 100 may be formed by manufacturing the first connection parts 110, attaching the first connection parts 110 to a tape, attaching the respective semiconductor chips 120 to the tape exposed to the respective through-holes 110H of the first connection parts 110, encapsulating the first connection parts 110 and the semiconductor chips 120 with the encapsulant 130, detaching the first connection parts 110 and the semiconductor chips 120 from the tape, attaching the first connection parts 110 and the semiconductor chips 120 to the carrier substrate 250, and then forming the second connection parts 140, the passivation layer 150, the underbump metal layer 160, and the connection terminals 170. In addition, a processing steps described below may be performed while the semiconductor package substrate 100 is attached to the carrier substrate 250. However, the present disclosure is not necessarily limited thereto. That is, as described below, the carrier substrate 250 may also be omitted by the method of reducing warpage of a semiconductor package substrate according to the present disclosure.

Figure 11:
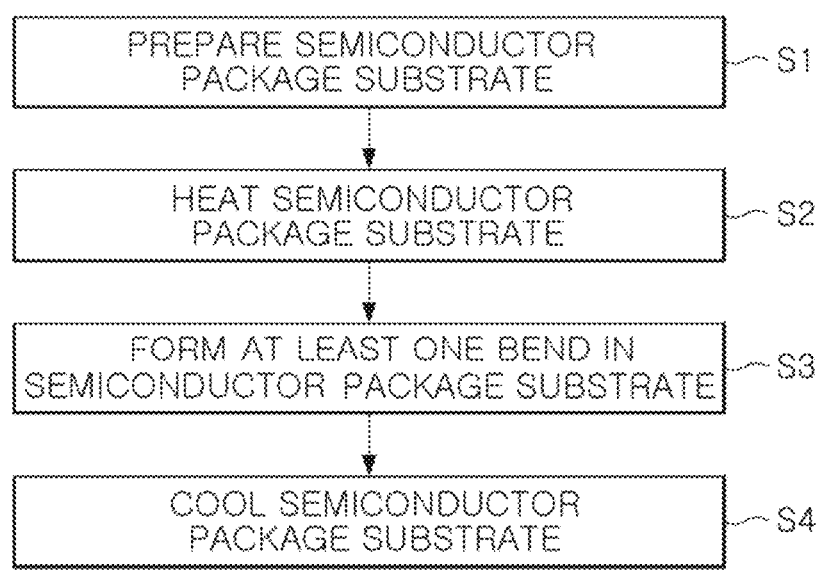
FIG. 11 is a schematic flow chart illustrating an example method for reducing warpage of a semiconductor package substrate, according to disclosed embodiments.

FIG. 11 is a schematic flow chart illustrating an example method 11 for reducing warpage of a semiconductor package substrate, according to disclosed embodiments. As used herein, "warpage" may refer to an undesirable, unintentional bending or wrapping of the semiconductor package substrate due to stress exerted on the semiconductor package substrate. As discussed below, to reduce warpage, bends may be intentionally formed in the semiconductor package substrate to reduce the stresses.

Referring to FIG. 11, the method 11 for reducing warpage of a semiconductor package substrate 100 may include preparing the semiconductor package substrate 100 (S1), heating the semiconductor package substrate 100 (S2), forming one or more bends in the heated semiconductor package substrate 100 (S3), and cooling the semiconductor package substrate 100 having the one or bends (S4).

Figure 12:
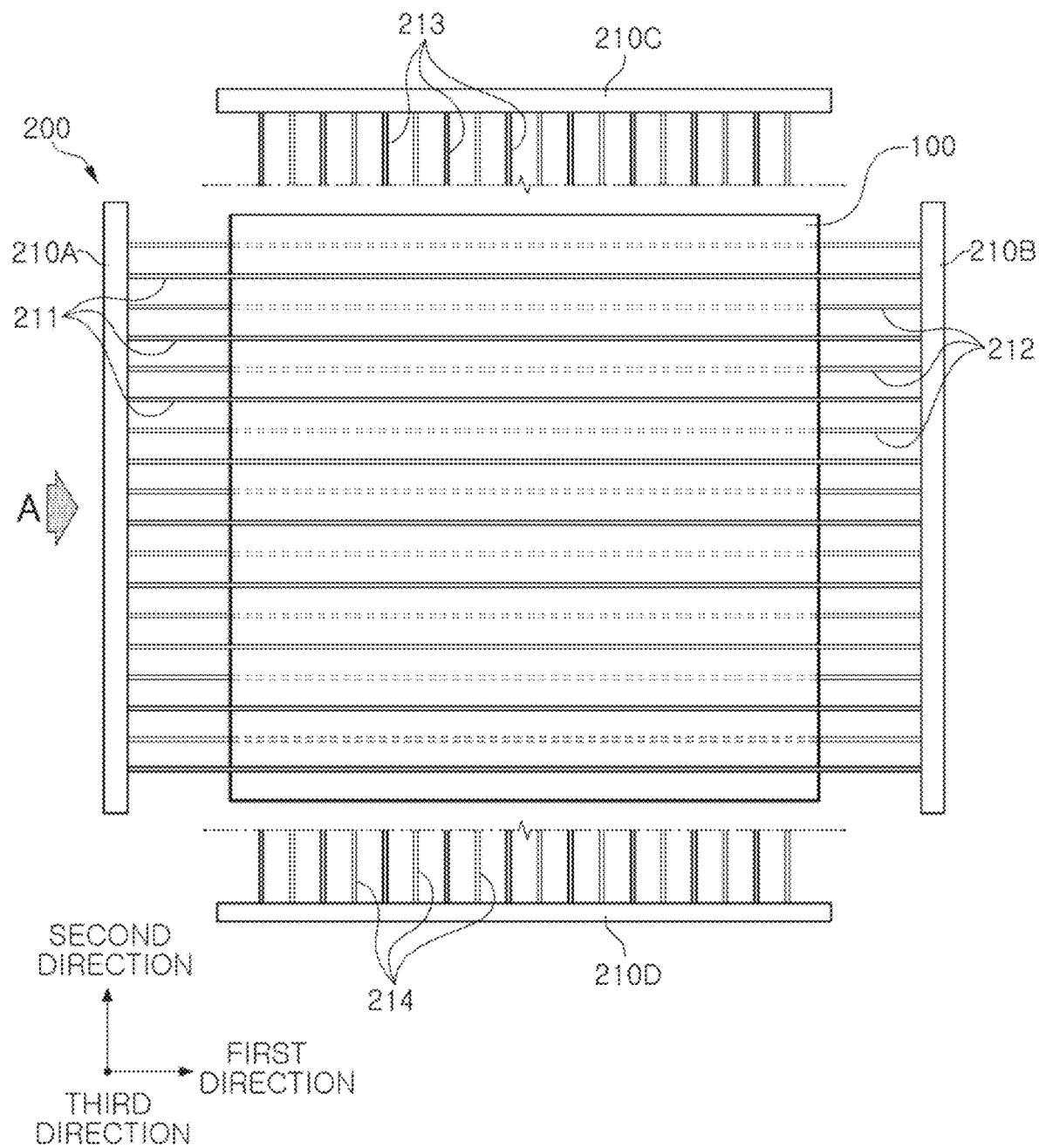
FIG. 12 is a schematic plan view of an example warpage reducing device used for the method of reducing warpage of a semiconductor package substrate according to FIG. 11.

FIG. 12 is a schematic plan view of an example warpage reducing device 200 used for the method of reducing warpage of a semiconductor package substrate 100 according to FIG. 11.

Figure 13:
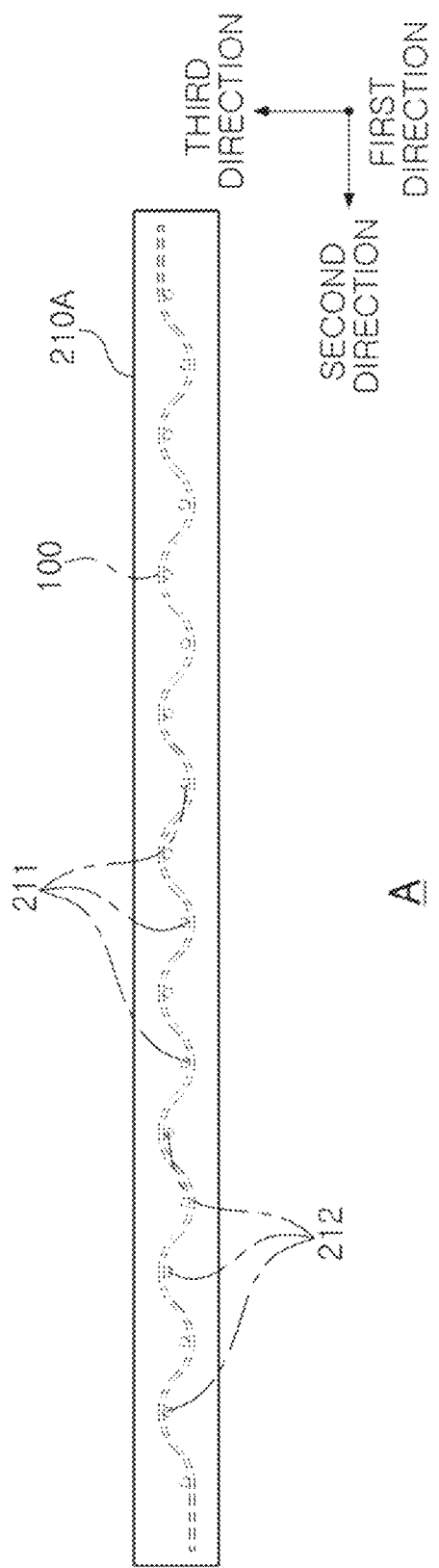
FIG. 13 is a schematic cross-sectional view of the warpage reducing device of FIG. 12 when viewed in direction A.

FIG. 13 is a schematic cross-sectional view of the warpage reducing device 200 of FIG. 12 when viewed in direction A in FIG. 12.

First, the semiconductor package substrate 100 may be prepared. The semiconductor package substrate 100 may have the structure described above (with reference to FIGS. 9 and 10), but is not limited thereto. Thus, it will be understood that the method of reducing warpage of a semiconductor package substrate may be applied to any substrate having warpage. The warpage reducing device 200 is used in order to form the one or more bends in the semiconductor package substrate 100. In order to do so, the semiconductor package substrate 100 may be disposed between support members 212 and 214 and pressing members 211 and 213 of the warpage reducing device 200 (FIG. 12). In an example, and as illustrated in FIG. 12, the semiconductor package substrate 100 may be positioned in the warpage reducing device 200 such that the support member 212 may be disposed below the semiconductor package substrate 100 and the pressing member 211 may be disposed above the semiconductor package substrate 100. Additionally or alternatively, the support member 214 may be disposed below the semiconductor package substrate 100 and the pressing member 213 may be disposed above the semiconductor package substrate 100.

The warpage of the semiconductor package substrate 100 may be reduced after the semiconductor package substrate 100 has been manufactured, and the carrier substrate 250 is detached from the semiconductor package substrate 100. That is, the manufactured semiconductor package substrate 100 may not have the carrier substrate 250 coupled thereto. Since the carrier substrate 250 is absent, costs may be reduced, and a reduction in a yield due to residue generated at the time of attaching and detaching the carrier substrate 250 may be minimized.

Then, the prepared (or otherwise manufactured) semiconductor package substrate 100 may be heated. The semiconductor package substrate 100 may be heated while it is disposed in the warpage reducing device 200. A method of heating the semiconductor package substrate 100 is not particularly limited. The method of heating the semiconductor package substrate 100 may be, for example, a method using a laser beam or hot air, but is not limited thereto. Meanwhile, the laser beam used to heat the semiconductor package substrate 100 may cover a region from an ultraviolet region to an infrared region.

The heating may be performed such that the target semiconductor package substrate 100 is heated to at least a glass transition temperature (Tg). The glass transition temperature (Tg) refers to a temperature at which glass transition is generated. For example, when the semiconductor package substrate 100 is a target of which warpage is to be reduced, the manufactured semiconductor package substrate 100 may be heated to at least a glass transition temperature (Tg) of a material constituting the encapsulant 130 and/or a material constituting the passivation layer 150, whichever corresponds to the outermost layer of the semiconductor package substrate 100.

When the carrier substrate 250 is attached to the semiconductor package substrate 100, the manufactured semiconductor package substrate 100 may be heated to at least a glass transition temperature (Tg) of a material constituting the carrier substrate 250. The semiconductor package substrate 100 may be relaxed by the heating, and, as a result, the warpage may be unwarped (or undone).

Then, multiple bends or curves may be formed in the heated semiconductor package substrate 100. For forming the bends, the warpage reducing device 200 may be used. The method for forming the bends using the warpage reducing device 200 is described below. Because of the bends, the semiconductor package substrate 100 may exhibit a wave shape or an embossed shape (See, FIGS. 14A and 14B, discussed below). Because the semiconductor package substrate 100 after being cooled may be bent instead of having warpage, a degree of freedom in driving the semiconductor package substrate 100 may be increased.

Then, the semiconductor package substrate 100 that is bent may be cooled. The semiconductor package substrate 100 may be cooled to ambient temperature. In an example, the semiconductor package substrate 100 may be cooled using an external cooling device such as a fan or the like. In an example, the semiconductor package substrate 100 may be cooled while the semiconductor package substrate 100 is disposed in the warpage reducing device 200. In this case, the semiconductor package substrate 100 may be cooled while semiconductor package substrate 100 is pressed using the support members 212 and 214 and the pressing members 211 and 213 of the warpage reducing device 200. Upon cooling, the semiconductor package substrate 100 may have wave-like shape or embossed shape described above instead of the warpage shape prior to the cooling. As understood, the wave-like shape may be obtained when either the first pressing members 211 or the second pressing members 213 exert a compressive force on the semiconductor package substrate 100. Alternatively, the embossed shaped may be obtained with both the first pressing members 211 and the second pressing members 213 exert compressive forces on the semiconductor package substrate 100.

After the semiconductor package substrate 100 is cooled, the support members 212 and 214 and the pressing members 211 and 213 of the warpage reducing device 200 may be disengaged from the semiconductor package substrate 100. Then, the semiconductor package substrate 100 of which the warpage is reduced may be removed from the warpage reducing device 200.

The warpage of the semiconductor package substrate 100 of which the warpage is more pronounced may be reduced through a series of processes. For example, when the method of reducing warpage of a semiconductor package substrate according to the exemplary embodiment is applied to the semiconductor package substrate 100 of which the warpage is approximately 22 mm, the warpage may be improved to approximately 2.5 mm. That is, the semiconductor package substrate 100 may have warpage approximately corresponding to a formed bends. Meanwhile, the maximum warpage may be measured as a height up to the highest point of a target after the target is put on a flat surface.

Figure 14A:
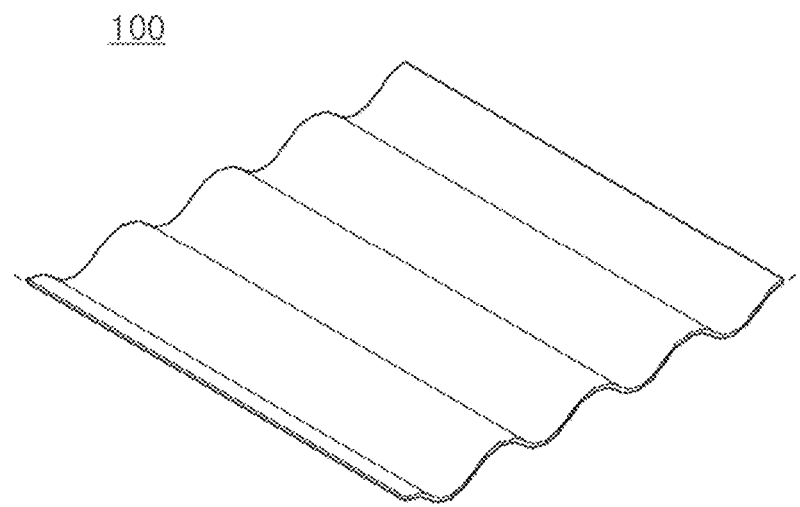
FIGS. 14A and 14B are schematic perspective views of the semiconductor package substrate 100 having a wave shape (FIG. 14A) or a embossed shape (FIG. 14B).
Figure 14B:
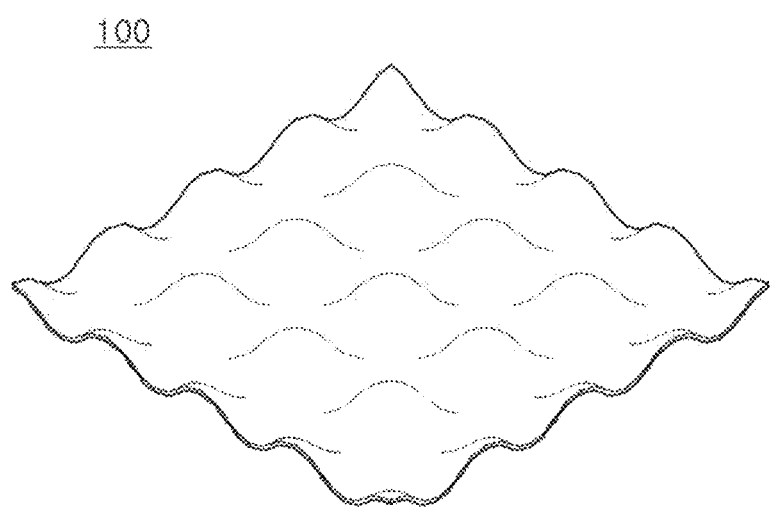

FIGS. 14A and 14B are schematic perspective views of the semiconductor package substrate 100 having a wave shape (FIG. 14A) or a embossed shape (FIG. 14B).

Referring to FIGS. 12, 13, 14A, and 14B, the warpage reducing device 200 may include a first connection part 210A and a second connection part 210B opposite the first connection part 210A in a first direction, first support members 212 connected to the first and second connection parts 210A and 210B in the first direction, and first pressing members 211 connected to the first and second connection parts 210A and 210B in the first direction. The first support members 212 and the first pressing members 211 may be spaced apart from each other by a predetermined interval in a third direction before they press a target, for example, the semiconductor package substrate 100, and the first support members 212 and/or the first pressing members 211 may move in the third direction to form the bends in the semiconductor package substrate 100, when they press the semiconductor package substrate 100. As discussed therein, a first direction, a second direction, and a third direction are mutually perpendicular to each other and are in relation to directions illustrated in the drawings. However, although a case in which the first direction, the second direction, and the third direction are perpendicular to each other is illustrated in the drawing, the first direction, the second direction, and the third direction are not limited thereto. That is, the first direction, the second direction, and the third direction may also have a slightly gradient error while being substantially perpendicular to each other.

The first connection part 210A and the second connection part 210B may oppose each other in the first direction, and may move the first support members 212 and/or the first pressing members 211 connected to the first connection part 210A and the second connection part 210B in the third direction. Materials or forms of the first connection part 210A and the second connection part 210B are not particularly limited. For example, each of the first connection part 210A and the second connection part 210B may include a metal and have a quadrangular frame shape, but is not limited thereto.

The first support members 212 may include a plurality of first bars elongated in the first direction. In addition, the first pressing members 211 may include a plurality of second bars elongated in the first direction. The first and second bars may be alternately spaced apart from each other in the second direction. Therefore, when the target is disposed between the plurality of first bars and the plurality of second bars, the bends may be formed by compressive forces acting on the target. In this case, a cross section of each of the first and second bars may be circular or annular (ring shape), which may be more effective in form the bends. A material of each of the first support member 212 and the first pressing member 211 may be a metal, but is not limited thereto.

When the warpage reducing device 200 includes only the first support members 212 and the first pressing members 211 as described above, the bends formed in the target semiconductor package substrate 100 may have an approximate wave shape, as illustrated in FIG. 14A.

The warpage reducing device 200 may further include a third connection part 210C and a fourth connection part 210D opposing each other in the second direction, second support members 214 connected to the third and fourth connection parts 210C and 210D in the second direction and connected to the first support members 212, and second pressing members 213 connected to the third and fourth connection parts 210C and 210D in the second direction and connected to the first pressing members 211. The second support members 214 and the second pressing members 213 may be connected to the first support members 212 and the first pressing members 211, respectively, and be spaced apart from each other by a predetermined interval in the third direction before they press the target, for example, the semiconductor package substrate 100, and the second support members 214 and/or the second pressing members 213 connected to the first support members 212 and/or the first pressing members 211, respectively, may move in the third direction to form a bend having a shape different from the wave shape in FIG. 14A, when they press the semiconductor package substrate 100.

The third connection part 210C and the fourth connection part 210D may be disposed opposite each other in the second direction, and may move the second support members 214 and/or the second pressing members 213 connected to the third connection part 210C and the fourth connection part 210D in the third direction. Materials or forms of the third connection part 210C and the fourth connection part 210D are not particularly limited. For example, each of the third connection part 210C and the fourth connection part 210D may include a metal and have a rectangular frame shape, but is not limited thereto.

The second support members 214 may include a plurality of third bars elongated in the second direction. In addition, the second pressing members 213 may include a plurality of fourth bars elongated in the second direction. The third and fourth bars may be alternately spaced apart from each other in the first direction. Therefore, when the target is disposed between the plurality of third bars and the plurality of fourth bars, the bends may be formed by compressive forces acting on the target. In this case, a cross section of each of the third and fourth bars may be circular or annular (ring shape), which may be more effective in forming the bends. A material of each of the second support member 214 and the second pressing member 213 may be a metal, but is not limited thereto.

When the warpage reducing device 200 according to the exemplary embodiment further includes the second support members 214 and the second pressing members 213, the bends formed in the semiconductor package substrate 100, which is a target, may have an approximate embossing shape, as illustrated in FIG. 14B.

As set forth above, according to the exemplary embodiment in the present disclosure, a method of reducing warpage of a semiconductor package substrate, and a warpage reducing device used for the same may be provided.

While exemplary embodiments have been shown and described above, it will be apparent to those skilled in the art that modifications and variations could be made without departing from the scope of the present disclosure as defined by the appended claims.

What is claimed is:

1. A warpage reducing device comprising:
    a first connection part;
    a second connection part provided opposite to the first connection part in a first direction;
    a first support member connected to the first connection part and the second connection part and extending in the first direction; and
    a first pressing member connected to the first connection part and the second connection part and extending in the first direction,
    wherein based on a target being disposed between the first support member and the first pressing member, at least one of the first support member and the first pressing member is configured to move in a second direction perpendicular to the first direction to exert a compressive force on the target thereby forming a plurality of bends in the target.

2. The warpage reducing device of claim 1, wherein:
    the first support member includes a plurality of first bars extending in the first direction,
    the first pressing member includes a plurality of second bars extending in the first direction, and
    the plurality of first bars and the plurality of second bars are alternately spaced apart from each other in a third direction, the third direction being perpendicular to the first direction and the second direction.

3. The warpage reducing device of claim 2, wherein a cross-section of each of the plurality of first bars and the plurality of second bars is annular.

4. The warpage reducing device of claim 2, wherein the plurality of bends have a wave shape.

5. The warpage reducing device of claim 1, further comprising:
    a third connection part and a fourth connection part opposite each other in a third direction, the third direction being perpendicular to the first direction and the second direction;
    a second support member connected to the third connection part and the fourth connection part, extending in the third direction and connected to the first support member; and
    a second pressing member connected to the third connection part and the fourth connection part, extending in the third direction and connected to the first pressing member,
    wherein at least one of the second support member and the second pressing member is configured to move in the second direction to exert the compressive force on the target together with the first support member and the first pressing member.

6. The warpage reducing device of claim 5, wherein:
    the second support member includes a plurality of third bars extending in the third direction,
    the second pressing member includes a plurality of fourth bars extending in the third direction, and
    the plurality of third bars and the plurality of fourth bars are alternately spaced apart from each other in the first direction.

7. The warpage reducing device of claim 6, wherein a cross-section of each of the plurality of third bars and the plurality of fourth bars is annular.

8. The warpage reducing device of claim 6, wherein the plurality of bends have an embossing shape.

* * * * *